(12) United States Patent
Nakata et al.

(10) Patent No.: US 12,519,041 B2
(45) Date of Patent: Jan. 6, 2026

(54) SEMICONDUCTOR MODULE FOR A POWER SEMICONDUCTOR DEVICE

(71) Applicant: FUJI ELECTRIC CO., LTD., Kawasaki (JP)

(72) Inventors: Hitoshi Nakata, Kawasaki (JP); Naoyuki Kanai, Kawasaki (JP); Yuichiro Hinata, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 415 days.

(21) Appl. No.: 18/161,571

(22) Filed: Jan. 30, 2023

(65) Prior Publication Data

US 2023/0298977 A1    Sep. 21, 2023

(30) Foreign Application Priority Data

Mar. 18, 2022   (JP) .................................. 2022-043577

(51) Int. Cl.
*H01L 23/495*   (2006.01)
*H01L 23/00*    (2006.01)

(52) U.S. Cl.
CPC .... *H01L 23/49562* (2013.01); *H01L 23/4952* (2013.01); *H01L 24/32* (2013.01); *H01L 24/33* (2013.01); *H01L 24/48* (2013.01); *H01L 24/49* (2013.01); *H01L 2224/32225* (2013.01); *H01L 2224/32245* (2013.01); *H01L 2224/33181* (2013.01)

(58) Field of Classification Search
CPC ........... H01L 23/49562; H01L 23/4952; H01L 24/32; H01L 24/33; H01L 24/48; H01L 24/49
See application file for complete search history.

(56) References Cited

U.S. PATENT DOCUMENTS

| | | | | |
|---|---|---|---|---|
| 2013/0105985 | A1* | 5/2013 | Tsuruoka | H01L 23/492 257/773 |
| 2014/0084438 | A1 | 3/2014 | Soyano | |
| 2020/0395259 | A1* | 12/2020 | Miyachi | H05K 3/3426 |
| 2021/0288016 | A1* | 9/2021 | Sato | H01L 24/40 |

FOREIGN PATENT DOCUMENTS

| | | |
|---|---|---|
| JP | 2006202885 A | 8/2006 |
| JP | 2021145083 A | 9/2021 |
| WO | 2013021726 A1 | 2/2013 |

* cited by examiner

*Primary Examiner* — Alonzo Chambliss
(74) *Attorney, Agent, or Firm* — Rabin & Berdo, P.C.

(57) ABSTRACT

A conductive member constituting a wiring structure includes a first bonding section bonded to an electronic component, a second bonding section bonded to a connection target for the electronic component, and a raised section that protrudes upward from the first bonding section and is connected to the second bonding section. The conductive member has a wire member passage through which a wire member passes, and which is provided in at least a part of the raised section. The wire member passage enables the wire member to be disposed along the raised section from the first bonding section to the second bonding section such that the wire member intersects a surface of the raised section.

7 Claims, 10 Drawing Sheets

SEMICONDUCTOR MODULE FOR A POWER SEMICONDUCTOR DEVICE

CROSS REFERENCE TO RELATED APPLICATIONS

This application is based upon and claims the benefit of priority of the prior Japanese Patent Application No. 2022-043577, filed on Mar. 18, 2022, the entire contents of which are incorporated herein by reference.

BACKGROUND OF THE INVENTION

Field of the Invention

The present invention relates to a wiring structure, a semiconductor module, and a vehicle.

Description of the Related Art

A semiconductor module provided with a semiconductor device such as an IGBT (insulated gate bipolar transistor), a power MOSFET (metal oxide semiconductor field effect transistor), and an FWD (free wheeling diode) has been used for industrial application including a motor driving control inverter of an elevator or the like. In recent years, such a semiconductor module has also been widely used for a vehicle-mounted motor driving control inverter. Requirements imposed on the vehicle-mounted motor driving control inverter include a reduction in size and weight for improving fuel consumption and a long-term reliability in a high-temperature operating environment for providing the inverter in an engine room.

To meet the requirements of a reduction in size and weight and a long-term reliability in a high-temperature operating environment, a known semiconductor module utilizes a metal wiring board to connect a semiconductor device and an electrode pattern to each other (e.g., Japanese Patent Laid-Open No. 2006-202885). The metal wiring board is also referred to as a lead frame, and is formed by press working of a metal sheet, for example.

For the sake of a layout of the semiconductor module, a wire may, in some cases, be routed to pass above the metal wiring board when the wire connection is to be made from a part of the metal wiring board. In this case, a limitation is imposed on a reduction in height in a portion where a raised section protruding upward in the metal wiring board overlaps the wire. This leads to a problem of an increase in an amount of movement in an up-down direction of a wire bonding tool in a wire bonding apparatus for wire bonding, affecting the productivity of the semiconductor module.

As a solution to this problem, for example, Japanese Patent Laid-Open No. 2021-145083 proposes to provide in a metal wiring board a coupling section composed of a wall portion intersecting respective main surfaces of two bonding sections bonded to a semiconductor device and an electrode pattern to couple the two bonding sections to each other with the coupling section interposed therebetween. A wall surface of the coupling section extends in an extension direction of the wire, thereby making it possible to pass the wire through a low position without interfering with the coupling section.

Even when a wire is disposed along a raised section in a metal wiring board, instead of the coupling section as in Japanese Patent Laid-Open No. 2021-145083, there is a need for making a position where the wire is disposed as low as possible to improve the productivity of a semiconductor module.

SUMMARY OF THE INVENTION

An object of the present invention, which has been made in view of such circumstances, is to provide a wiring structure, a semiconductor module, and a vehicle, with which an improvement in productivity can be achieved.

A wiring structure according to an aspect of the present invention includes an electronic component and a conductive member that electrically connects the electronic component to a connection target for the electronic component, in which the conductive member includes a first bonding section bonded to the electronic component, a second bonding section bonded to the connection target, a raised section that protrudes upward from the first bonding section and is connected to the second bonding section, and a wire member passage section in a shape of opening that is provided in at least a part of the raised section and enables a wire member disposed along the raised section from the first bonding section to be connected to the first bonding section such that the wire member intersects a surface along the raised section.

According to the present invention, in the wiring structure in which the wire member is disposed along the raised portion in the conductive member, a position of the wire member is reduced, thereby making it possible to improve a productivity.

DETAILED DESCRIPTION OF THE PREFERRED EMBODIMENT

A structure of a semiconductor module to which a wiring structure according to an embodiment of the present invention is applied will be described below with reference to the drawings. In the following description and drawings, a longitudinal direction, a direction perpendicular to the longitudinal direction, and a height direction of the semiconductor module or a lead frame are respectively defined as an X-direction, a Y-direction, and a Z-direction. The Y-direction is also expressed as a width direction. The Z-direction is also expressed as an up-down direction. "Upward" represents a direction away from a first bonding section 20 (an upward direction in the Z-direction). The X-direction, the Y-direction, the Z-direction are in a relationship in which they are perpendicular to one another. Viewing in the Z-direction is a planar view, and viewing in the Y-direction is a side view. The up-down direction in the semiconductor module does not necessarily match an up-down direction of apparatuses and devices to which the semiconductor module is attached.

Figure 1:
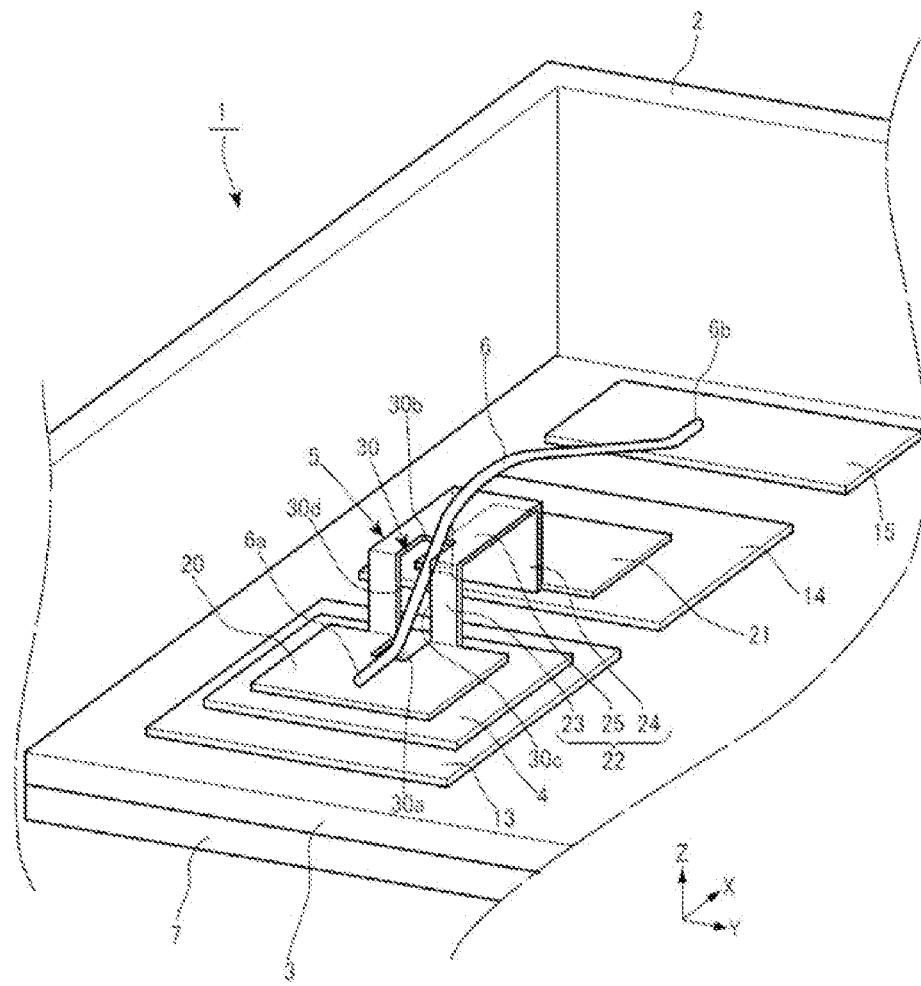
FIG. 1 is a perspective view illustrating a configuration of a semiconductor module to which a wiring structure according to a first embodiment of the present invention is applied.
Figure 2:
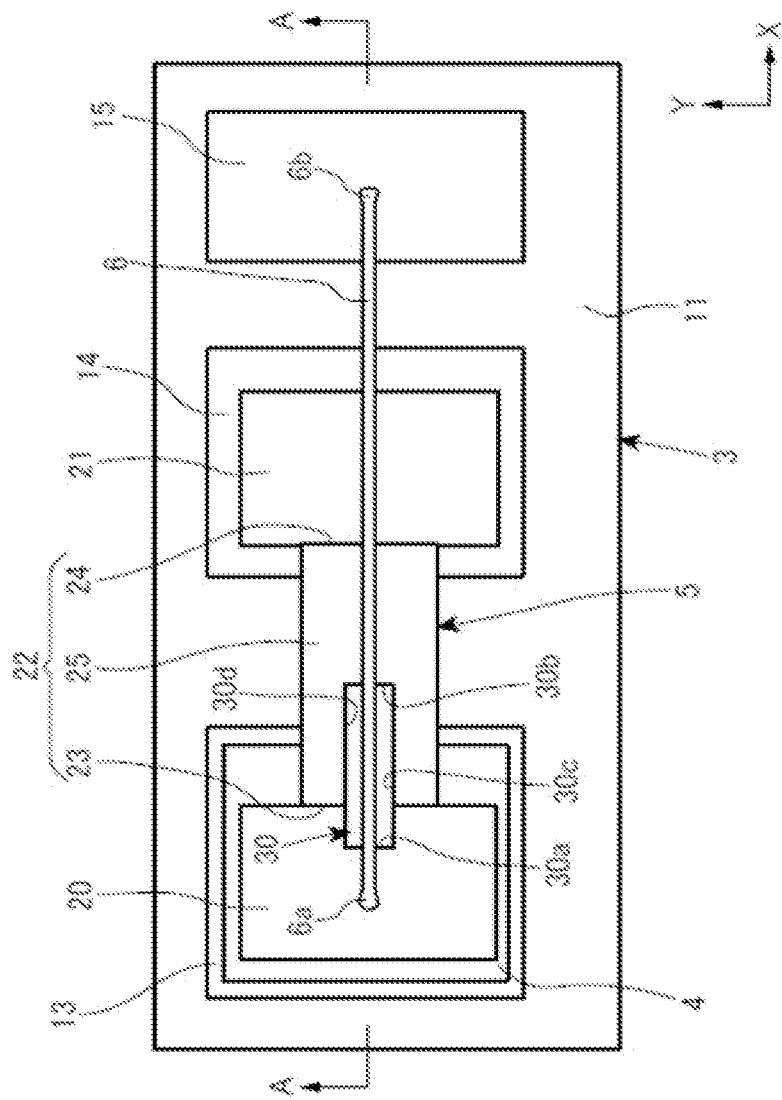
FIG. 2 is a plan view illustrating an internal structure of the semiconductor module illustrated in FIG. 1.
Figure 3:
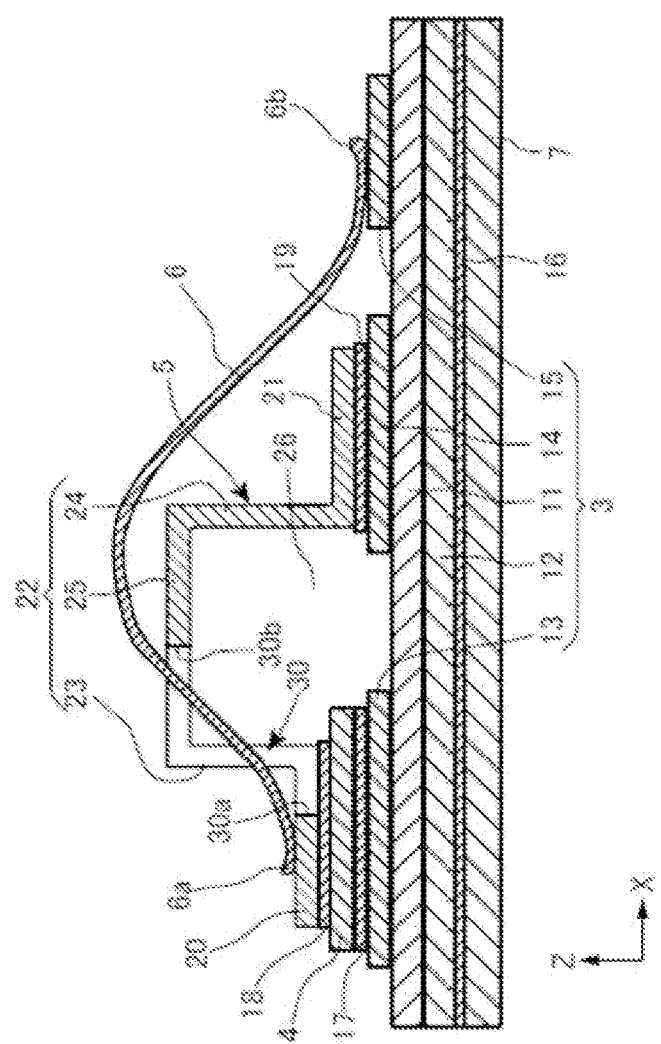
FIG. 3 is a cross-sectional view taken along a line A-A illustrated in FIG. 2.
Figure 4:
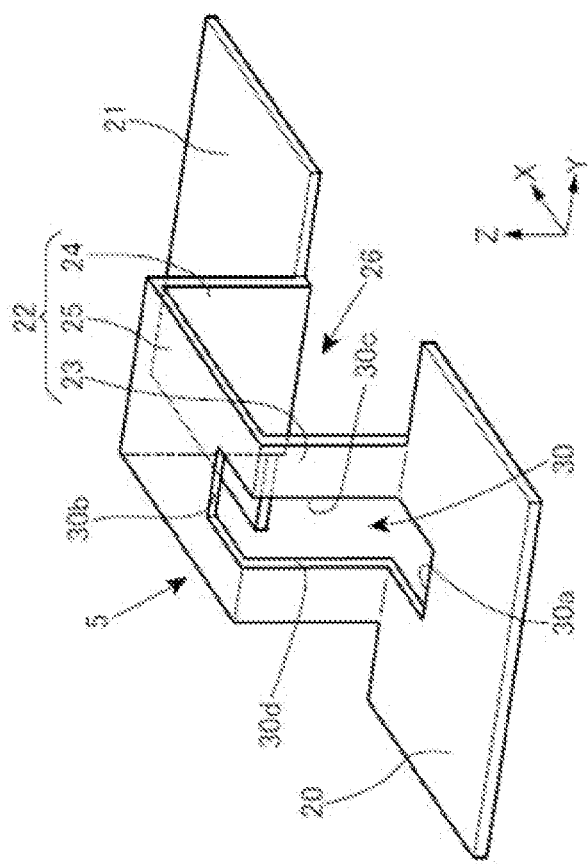
FIG. 4 is a perspective view of a lead frame constituting the wiring structure according to the first embodiment.

FIG. 1 is a perspective view illustrating a configuration of a semiconductor module 1 to which a wiring structure according to a first embodiment of the present invention is applied. FIG. 2 is a plan view illustrating an internal structure of the semiconductor module 1 illustrated in FIG. 1. FIG. 3 is a cross-sectional view taken along a line A-A illustrated in FIG. 2. FIG. 4 is a perspective view of a lead frame 5 constituting the wiring structure according to the first embodiment.

The semiconductor module 1 is configured by arranging an insulating circuit board 3, a semiconductor device 4, a lead frame 5, a wire 6, and the like in a case 2. The semiconductor device 4 is an example of an electronic component in the present embodiment. The lead frame 5 is an example of a conductive member in the present embodiment. The wire 6 is an example of a wire member in the present embodiment. In FIG. 1, illustration of a part of the case 2 is omitted to illustrate a structure in the case 2.

The insulating circuit board 3 is composed of a DCB (direct copper bonding) substrate, an AMB (active metal brazing) substrate, or a metal base substrate, for example, and is formed in a rectangular shape in a planar view as a whole. As illustrated in FIG. 3, the insulating circuit board 3 is configured by laminating an insulating plate 11, a heat dissipation plate 12, and a plurality of circuit patterns 13, 14, and 15. The circuit pattern 14 is an example of a connection target for the electronic component in the present embodiment.

The insulating plate 11 is formed of a plate-shaped body having an upper surface and a lower surface directed in the Z-direction, and has a rectangular shape in a planar view extending in the X-direction. The insulating plate 11 is formed of a ceramic material such as aluminum nitride (AlN), silicon nitride ($Si_3O_4$), aluminum oxide ($Al_2O_3$), or aluminum oxide ($Al_2O_3$) and zirconium oxide ($ZrO_2$). The insulating plate 11 may be formed of thermosetting resin such as epoxy resin or polyimide resin or a composite material of thermosetting resin and glass or a ceramic material used as a filler.

The heat dissipation plate 12 is formed of a plate-shaped body having a shape overlapping the insulating plate 11, for example, a metal sheet having a high thermal conductivity made of copper, aluminum, or the like. The heat dissipation plate 12 is arranged on the lower surface of the insulating plate 11. A lower surface of the heat dissipation plate 12 functions as a heat dissipation surface for releasing heat of the semiconductor device 4. The heat dissipation plate 12 is bonded to an upper surface of a base substrate 7 with a bonding material 16 such as a solder interposed therebetween.

The circuit patterns 13, 14, and 15 respectively have predetermined thicknesses in the Z-direction, and are arranged on the upper surface of the insulating plate 11. The circuit patterns 13, 14, and 15 are respectively formed in island shapes electrically independent of one another, and are spaced apart from one another in the X-direction on the insulating plate 11. The circuit patterns 13, 14, and 15 are each formed of a metal sheet having a good thermal conductivity and electrical conductivity such as copper or aluminum, for example. The circuit patterns 13, 14, and 15 may be each referred to as a circuit layer, an electrode pattern, a wiring, or the like.

The number of circuit patterns is not limited to three, as illustrated in FIG. 1 to FIG. 3, but is appropriately changeable. For example, four or more circuit patterns may be arranged on the upper surface of the insulating plate 11. Respective shapes, arrangement portions, and the like of the circuit patterns are not limited to those in the configuration illustrated in FIG. 1 to FIG. 3, but are appropriately changeable.

The semiconductor device 4 is arranged on an upper surface of the circuit pattern 13 with a bonding material 17 having a conductivity such as a solder or a sintered material interposed therebetween. The semiconductor device 4 is formed in a rectangular shape in a planar view of a semiconductor substrate made of silicon or the like, for example. The semiconductor device 4 may be formed using a semiconductor substrate made of silicon carbide (SiC), gallium nitride (GaN), or the like in addition to silicon. In the semiconductor device 4, a switching element such as an IGBT and a MOSFET or a diode such as an FWD may be formed.

The semiconductor device 4 has an upper surface and a lower surface directed in the Z-direction, and electrodes (not illustrated) are respectively formed on the surfaces. For example, a main electrode and a gate electrode are formed on the upper surface of the semiconductor device 4, and a main electrode is also formed on the lower surface of the semiconductor device 4. In the present embodiment, the main electrode is an electrode through which a main current flows, and the gate electrode is an electrode for turning on and off the main current.

The upper surface (main electrode) of the semiconductor device 4 and an upper surface of the circuit pattern 14 are electrically connected to each other by the lead frame 5. The lead frame 5 functions as a part of a path of the main current flowing in the semiconductor module 1.

The lead frame 5 is composed of a plate-shaped body having front and rear surfaces. The lead frame 5 is formed of a metal such as copper, a copper alloy, an aluminum alloy, or an iron alloy, and is manufactured by press working for a metal sheet. The lead frame 5 may be referred to as a metal wiring board.

The lead frame 5 is an elongated body extending in the X-direction in a planar view, and has a crank shape having a plurality of bending portions in a side view when viewed in the Y-direction. Specifically, the lead frame 5 includes a first bonding section 20, a second bonding section 21, and a raised section 22. The first bonding section 20 is bonded to the upper surface of the semiconductor device 4 with a bonding material 18 such as a solder interposed therebetween. The second bonding section 21 is bonded to the upper surface of circuit pattern 14 with a bonding material 19 such as a solder interposed therebetween. The raised section 22 couples the first bonding section 20 and the second bonding section 21 to each other.

The first bonding section 20 is a plate-shaped portion having a thickness in the Z-direction, and has an upper surface directed upward and a lower surface directed downward in the Z-direction. The first bonding section 20 is formed in a rectangular shape in a planar view, and has a pair of end portions on both sides in the X-direction and a pair of end portions on both sides in the Y-direction. The lower surface of the first bonding section 20 is arranged to oppose an upper surface electrode of the semiconductor device 4 in the Z-direction, and is bonded to the semiconductor device 4 with the bonding material 18 interposed therebetween.

The second bonding section 21 is a plate-shaped portion having a thickness in the Z-direction, and has an upper surface directed upward and a lower surface directed downward in the Z-direction. The second bonding section 21 is formed in a rectangular shape in a planar view, and has a pair of end portions on both sides in the X-direction and a pair of end portions on both sides in the Y-direction. The lower surface of the second bonding section 21 is arranged to oppose the circuit pattern 14 in the Z-direction, and is bonded to the circuit pattern 14 with the bonding material 19 interposed therebetween.

The raised section 22 protrudes upward in the Z-direction from the first bonding section 20, and is connected to the second bonding section 21. More specifically, the raised section 22 includes a first upstanding wall section 23, a second upstanding wall section 24, and a connection section 25. The first upstanding wall section 23 has a shape rising upward in the Z-direction from one end portion in the X-direction of the first bonding section 20 (an end portion on the side closer to the second bonding section 21). The second upstanding wall section 24 has a shape rising upward in the Z-direction from one end portion in the X-direction of the second bonding section 21 (an end portion on the side closer to the first bonding section 20). The connection section 25 extends in the X-direction, and connects an upper end of the first upstanding wall section 23 and an upper end of the second upstanding wall section 24 to each other. The first upstanding wall section 23 and the second upstanding wall section 24 are each a plate-shaped portion having planes respectively composed of components in the Y-direction and the Z-direction on its front and rear sides and having a thickness in the X-direction. The first upstanding wall section 23 and the second upstanding wall section 24 are each formed in a rectangular shape in a side view when viewed in the X-direction. The connection section 25 is a plate-shaped portion having planes respectively composed of components in the X-direction and the Y-direction on its front and rear sides and having a thickness in the Z-direction. The connection section 25 is formed in a rectangular shape in a planar view.

In the lead frame 5 thus configured, the first bonding section 20, the second bonding section 21, and the raised section 22 are arranged side by side in the X-direction in a planar view, as illustrated in FIG. 2. The width in the Y-direction of the raised section 22 is smaller than the respective widths in the Y-direction of the first bonding section 20 and the second bonding section 21.

As illustrated in FIG. 3, in the lead frame 5, the raised section 22 protrudes upward with respect to the first bonding section 20 and the second bonding section 21 in a side view when viewed in the Y-direction, and an internal space 26, which is surrounded by respective surfaces of the first upstanding wall section 23, the second upstanding wall section 24, and the connection section 25 constituting the raised section 22, is formed. The internal space 26 penetrates through the lead frame 5 in the Y-direction.

The number of lead frames 5, described above, and a shape, an arrangement portion, and the like of each of the lead frames 5 are merely examples, and are not limitations, but are appropriately changeable. For example, a plurality of lead frames 5 may be arranged for each semiconductor module 1. The width in the Y-direction of the lead frame 5 may be uniform as the whole of the first bonding section 20, the second bonding section 21, and the raised section 22. The first bonding section 20, the second bonding section 21, and the raised section 22 need not be arranged side by side in a row in the X-direction but may be arranged to diagonally shift from one another. The thickness of the lead frame 5 may partially differ.

One end portion 6a of the wire 6 is bonded to the upper surface of the first bonding section 20 in the lead frame 5 by wire bonding using a ultrasonic wave or the like. The other end 6b of the wire 6 is bonded to an upper surface of the circuit pattern 15 by wire bonding using a ultrasonic wave or the like. The wire 6 has a loop shape curved to protrude upward between the end portion 6a and the end portion 6b. The upper surface of the semiconductor device 4 and the circuit pattern 15 are electrically connected to each other via the first bonding section 20 in the lead frame 5 and the wire 6. The circuit pattern 15 is a source control portion, for example. The end portion 6b of the wire 6 may be bonded to a metal terminal (not illustrated) embedded in the case 2 and partially exposed by wire bonding using a ultrasonic wave or the like. In this case, the upper surface of the semiconductor device 4 and the metal terminal are electrically connected to each other via the first bonding section 20 in the lead frame 5 and the wire 6. The metal terminal is a source control terminal, for example.

The wire 6 is bonded to the first bonding section 20 and the circuit pattern 15 using a wire bonding apparatus. The wire bonding apparatus has a wire bonding tool that operates in the Z-direction, although not illustrated. When the end portion 6a of the wire 6 is bonded to the upper surface of the first bonding section 20 and when the end portion 6b is bonded to the upper surface of the circuit pattern 15, the wire bonding tool moves downward in the Z-direction.

Components in the semiconductor module 1 configured as described above are arranged in the case 2. The case 2 is formed of a nonconductive material such as synthetic resin, and has an outer wall portion extending to a position sufficiently higher than an upper end portion of the lead frame 5 (an upper surface of the connection section 25) in the Z-direction. As a result, the case 2 defines a space surrounding the insulating circuit board 3, the semiconductor device 4, the lead frame 5, the wire 6, and the like and accommodating these components.

An internal space of the semiconductor module 1 surrounded by the case 2 is filled with sealing resin (not illustrated). The internal space may be filled with sealing resin such that the sealing resin reaches an upper end of the case 2. The insulating circuit board 3, the semiconductor device 4, the lead frame 5, the wire 6, and the like are covered with sealing resin and are insulated and protected thereby. The internal space 26 in the lead frame 5 is also filled with sealing resin.

Sealing resin is composed of thermosetting resin, for example. Sealing resin preferably contains at least one of epoxy, silicon, urethane, polyimide, polyamide, polyamide-imide. Epoxy resin into which a filler is mixed, for example, is preferable for sealing resin in terms of insulation, heat resistance, and heat dissipation.

In the semiconductor module 1, the raised section 22 in the lead frame 5 is arranged between the first bonding section 20 in the lead frame 5 and the circuit pattern 15, which are connected to each other by the wire 6, in the X-direction. The raised section 22 protrudes upward with respect to the first bonding section 20, and has surfaces (the first upstanding wall section 23 and the second upstanding wall section 24) intersecting a straight line connecting the end portion 6a and the end portion 6b of the wire 6. Therefore, the wire 6 cannot be linearly disposed in the X-direction as it is from a bonding portion (the end portion 6a) to be bonded to the first bonding section 20, and needs to be arranged along the raised section 22.

If the wire 6 is arranged to extend above the entire raised section 22, the wire 6 is made to have a large-sized loop shape having a large amount of upward protrusion, thereby making it difficult to reduce the height (the size in the Z-direction) of the semiconductor module 1. To prevent interference with the raised section 22, an amount of movement in the Z-direction of the wire bonding tool used when the wire 6 is bonded needs to be increased, thereby affecting the productivity efficiency of the semiconductor module 1.

To solve such a problem, the lead frame 5 in the wiring structure according to the first embodiment illustrated in FIG. 1 to FIG. 4 includes a wire passage 30 in a shape of opening that penetrates therethrough in its thickness direction. The wire passage 30 is a through hole (slit) formed in the middle in a width direction (Y-direction) of the raised section 22, and is formed in a part in a longitudinal direction of the lead frame 5. The middle in the width direction (Y-direction) means being between one side portion and the other side portion of the raised section 22. In other words, the raised section 22 is uninterruptedly formed on both sides of the wire passage 30 in the width direction (Y-direction). The wire passage 30 is an example of a wire member passage in the present embodiment.

Specifically, the wire passage 30 is formed to extend over the first upstanding wall section 23 and the connection section 25 in the raised section 22, and is further formed to extend over the first upstanding wall section 23 and the first bonding section 20. The wire passage 30 has its one end portion 30a in the longitudinal direction positioned in the first bonding section 20 and its other end portion 30b in the longitudinal direction positioned in the connection section 25. Between the end portion 30a and the end portion 30b, a side surface 30c and a side surface 30d substantially parallel to each other that oppose each other with a spacing therebetween in the Y-direction are respectively formed as inner surfaces of the wire passage 30. In the first bonding section 20, the wire passage 30 extends in the X-direction from the end portion 30a to a boundary position with a lower end of the first upstanding wall section 23. In the connection section 25, the wire passage 30 extends in the X-direction from the end portion 30b to a boundary position with the upper end of the first upstanding wall section 23. In the first upstanding wall section 23, the wire passage 30 extends in the Z-direction. The side surface 30c and the side surface 30d may be formed not to be substantially parallel to each other. For example, the side surface 30c and the side surface 30d may be inclined such that the spacing therebetween in the Y-direction widens toward the end portion 30b from the end portion 30a. The side surface 30c and the side surface 30d may be inclined such that the spacing therebetween in the Y-direction narrows toward the end portion 30b from the end portion 30a.

That is, the wire passage 30 is formed as a through hole having a shape bent in two portions from the middle (the end portion 30a) of the first bonding section 20 to the middle (the end portion 30b) of the connection section 25 via the first upstanding wall section 23 in the longitudinal direction of the lead frame 5.

As illustrated in FIG. 2, the wire passage 30 is positioned on a straight line connecting the end portion 6a and the end portion 6b of the wire 6 in a planar view. The width (the spacing between the side surface 30c and the side surface 30d) of the wire passage 30 in the Y-direction is larger than the diameter of the wire 6. Therefore, the wire 6 can be passed through the wire passage 30.

As illustrated in FIG. 3, the wire 6 is arranged such that its part passes through the wire passage 30 to intersect surfaces (the first upstanding wall section 23 and the connection section 25) along the raised section 22. The following is a disposition path of the wire 6 in a case where the end portion 6a side set as a starting point. The wire 6 that has bonded the end portion 6a to the first bonding section 20 is directed upward while extending in the X-direction from the end portion 6a, to pass through the wire passage 30, intersect the first upstanding wall section 23 in the raised section 22, and pass through the internal space 26 in the raised section 22. Then, the wire 6 passes through the wire passage 30, intersects the connection section 25 to exit the internal space 26, passes above the connection section 25 in the raised section 22, and changes its direction to a downward direction while maintaining the extension in the X-direction, passes above the second upstanding wall section 24 and the second bonding section 21, and bonds the end portion 6b to the circuit pattern 15.

Thus, the wire passage 30 is an opening or a cut-off and is provided in the lead frame 5 allows the wire 6 to be connected to the first bonding section 20 in an arrangement intersecting the surfaces (the first upstanding wall section 23 and the connection section 25) along the raised section 22. A part of the wire 6 enters the internal space 26 in the raised section 22 through the wire passage 30. As a result, a loop shape of the wire 6 is smaller than that in a configuration in which the wire 6 is arranged to extend above the entire raised section 22. Accordingly, the upward height of the wire 6 can be suppressed, thereby making it possible to achieve a reduction in the height of the semiconductor module 1.

The height of the wire 6 is suppressed, thereby making it possible to reduce an amount of upward movement of the wire bonding tool in a portion of the raised section 22 when the wire 6 is bonded by the wire bonding apparatus. The wire passage 30 has a shape opened upward, and has such a width in the Y-direction that the wire 6 can enter the wire passage 30. When the wire 6 passes through the wire passage 30, the wire bonding tool need not rapidly move in the Z-direction to avoid interference with the first upstanding wall section 23, thereby making it possible to achieve a smooth operation. From these reasons, the wire 6 can be efficiently attached using the wire bonding apparatus, thereby improving the productivity of the semiconductor module 1.

When the case 2 in the semiconductor module 1 is filled with sealing resin, the internal space 26 in the raised section 22 can be filled with the sealing resin through the wire passage 30, thereby making it easy to prevent a region not filled with sealing resin from occurring around the lead frame 5.

If bubbles contained in sealing resin enters the internal space 26 in the raised section 22, a defoaming effect for letting air out of the internal space 26 through the wire passage 30 can be obtained.

The wire passage 30 is formed in not only the first upstanding wall section 23 and the connection section 25 in the raised section 22 respectively having the surfaces intersecting the wire 6 but also the first bonding section 20 bonded to the semiconductor device 4, thereby making it possible to improve the above-described effect relating to filling with sealing resin and defoaming.

An arrangement and a shape of the wire passage provided in the lead frame 5 are not limited to those in the above-described configuration. Then, another embodiment of a wiring structure in a semiconductor module 1 will be described with reference to FIG. 5 to FIG. 9. Sections common to those in the above-described first embodiment are assigned the same reference numerals in FIG. 5 to FIG. 9, to omit description thereof.

Figure 5:
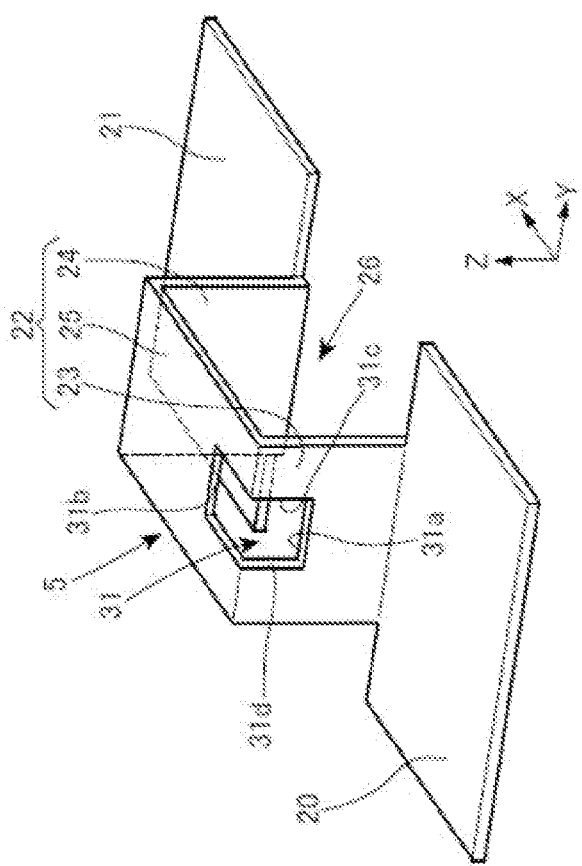
FIG. 5 is a perspective view of a lead frame constituting a wiring structure according to a second embodiment.

FIG. 5 is a perspective view illustrating a lead frame 5 constituting a wiring structure according to a second embodiment. In the second embodiment, a wire passage 31 in the lead frame 5 has an L-shaped structure formed to extend over only a first upstanding wall section 23 and a connection section 25 in a raised section 22, and the wire passage 31 is not formed in a first bonding section 20.

Specifically, the wire passage 31 has its one end portion 31a in its longitudinal direction positioned in the first upstanding wall section 23 and its other end portion 31b in the longitudinal direction positioned in the connection section 25. Between the end portion 31a and the end portion 31b, a side surface 31c and a side surface 31d substantially parallel to each other with a spacing therebetween in the Y-direction are respectively formed as inner surfaces of the wire passage 31. The side surface 31c and the side surface 31d may be formed not to be substantially parallel to each other. For example, the side surface 31c and the side surface 31d may be inclined such that the spacing therebetween in the Y-direction widens toward the end portion 31b from the end portion 31a. The side surface 31c and the side surface 31d may be inclined such that the spacing therebetween in the Y-direction narrows toward the end portion 31b from the end portion 31a.

The wire passage 31 having such a shape is common to the wire passage 30 in the above-described first embodiment in that a wire 6 can be arranged to intersect the first upstanding wall section 23 and the connection section 25 in the raised section 22. Therefore, the lead frame 5 includes the wire passage 31, to suppress the upward height of the wire 6, thereby making it possible to achieve a reduction in the height of the semiconductor module 1 and an improvement in the productivity of a semiconductor module 1 (the efficiency of an operation of a wire bonding tool).

Through the wire passage 31, an efficiency in which an internal space 26 in the raised section 22 is filled with sealing resin can be promoted, and air contained in sealing resin can be let out of the internal space 26.

Figure 6:
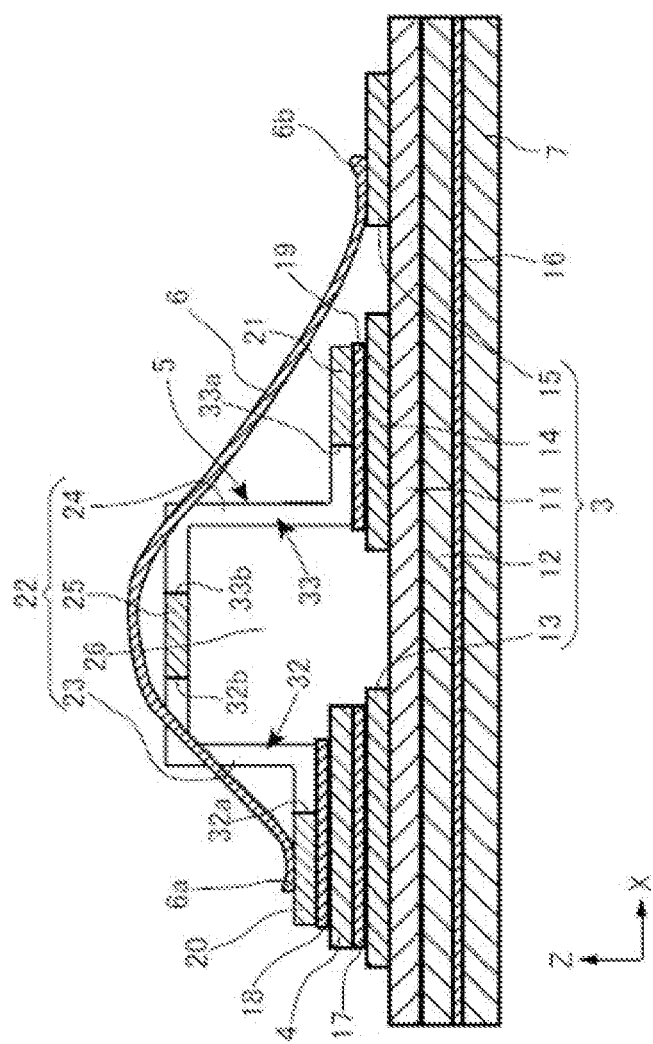
FIG. 6 is a cross-sectional view illustrating a wiring structure according to a third embodiment.
Figure 7:
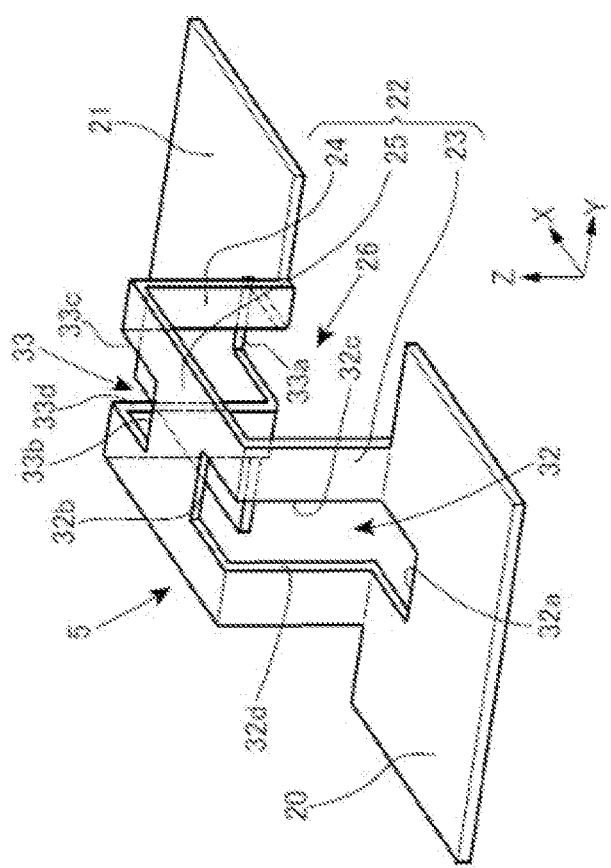
FIG. 7 is a perspective view of a lead frame constituting the wiring structure according to the third embodiment.

FIG. 6 is a cross-sectional view illustrating a wiring structure according to a third embodiment, and FIG. 7 is a perspective view of a lead frame 5 constituting the wiring structure according to the third embodiment. FIG. 6 illustrates a cross-sectional structure of a similar position to that illustrated in FIG. 3. In the third embodiment, the lead frame 5 includes a wire passage 32 as a first wire member passage and a wire passage 33 as a second wire member passage.

The wire passage 32 is formed at a similar position to that of the wire passage 30 in the above-described first embodiment. The wire passage 32 is formed to extend over a first upstanding wall section 23 and a connection section 25 in a raised section 22, and is further formed to extend over the first upstanding wall section 23 and a first bonding section 20. The wire passage 32 has its one end portion 32a in its longitudinal direction positioned in the first bonding section 20 and its other end portion 32b in the longitudinal direction positioned in the connection section 25. Between the end portion 32a and the end portion 32b, a side surface 32c and a side surface 32d substantially parallel to each other with a spacing therebetween in the Y-direction are respectively formed as inner surfaces of the wire passage 32. The side surface 32c and the side surface 32d may be formed not to be substantially parallel to each other. For example, the side surface 32c and the side surface 32d may be inclined such that the spacing therebetween in the Y-direction widens toward the end portion 32b from the end portion 32a. The side surface 32c and the side surface 32d may be inclined such that the spacing therebetween in the Y-direction narrows toward the end portion 32b from the end portion 32a. The end portion 32a may be positioned in the first upstanding wall section 23.

The wire passage 33 is formed to extend over a second upstanding wall section 24 and the connection section 25 in the raised section 22, and is further formed to extend over the second upstanding wall section 24 and a second bonding section 21. The wire passage 33 has its one end portion 33a in its longitudinal direction positioned in the second bonding section 21 and has its other end portion 33b in the longitudinal direction positioned in the connection section 25. Between the end portion 33a and the end portion 33b, a side surface 33c and a side surface 33d substantially parallel to each other with a spacing therebetween in the Y-direction are respectively formed as inner surfaces of the wire passage 33. The side surface 33c and the side surface 33d may be formed not to be substantially parallel to each other. For example, the side surface 33c and the side surface 33d may be inclined such that the spacing therebetween in the Y-direction widens toward the end portion 33b from the end portion 33a. The side surface 33c and the side surface 33d may be inclined such that the spacing therebetween in the Y-direction narrows toward the end portion 33b from the end portion 33a. The end portion 33a may be positioned in the second upstanding wall section 24.

The respective widths of the wire passage 32 and 33 in the Y-direction each have such a size that the wire 6 can enter the wire passage.

As illustrated in FIG. 6, in the raised section 22, the wire passages 32 and 33 are respectively provided in both a region extending over the first upstanding wall section 23 and the connection section 25 and a region extending over the second upstanding wall section 24 and the connection section 25, thereby making it possible to arrange the wire 6 to intersect each of the first upstanding wall section 23, the second upstanding wall section 24, and the connection section 25. As a result, the upward height of the wire 6 can be suppressed, thereby making it possible to achieve a reduction in the height of the semiconductor module 1 and an improvement in the productivity of the semiconductor module 1 (the efficiency of an operation of a wire bonding tool).

Particularly, in the raised section 22, a boundary portion between the first upstanding wall section 23 and the connection section 25 and a boundary portion between the second upstanding wall section 24 and the connection section 25 each have an angular shape. The wire passages 32 and 33 are respectively formed in the boundary portions, thereby making it easy to suppress the height of the wire 6 in a portion along the raised section 22 when both an end portion 6a and an end portion 6b of the wire 6 are respectively at positions lower than the raised section 22.

Through the two wire passages 32 and 33, an efficiency in which an internal space 26 in the raised section 22 is filled with sealing resin can be promoted, and air contained in sealing resin can be let out of the internal space 26.

Figure 8:
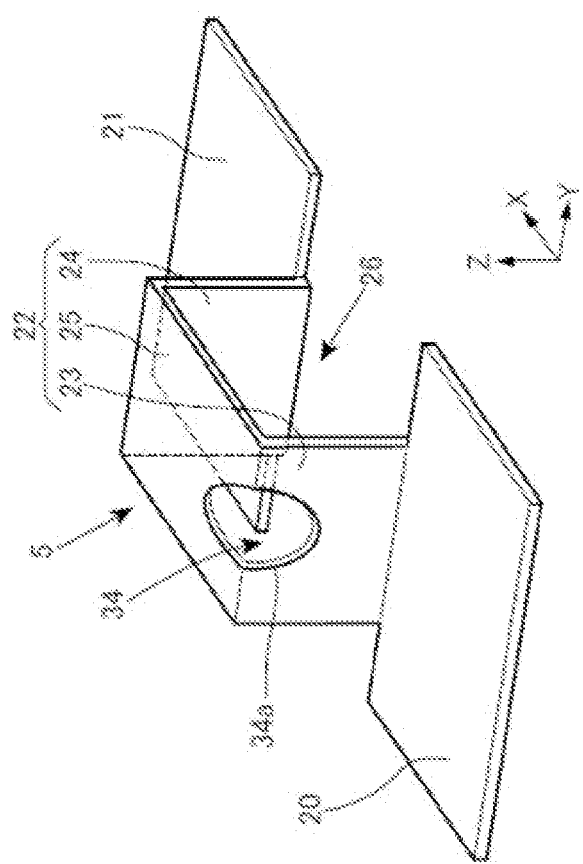
FIG. 8 is a perspective view of a lead frame constituting a wiring structure according to a fourth embodiment.

FIG. 8 is a perspective view illustrating a lead frame 5 constituting a wiring structure according to a fourth embodiment. In the fourth embodiment, a wire passage 34 in the lead frame 5 has an inner side surface 34a having not a rectangular shape in a planar view but a curved shape. The wire passage 34 is formed to extend over a first upstanding wall section 23 and a connection section 25 in a raised section 22. A second wire passage (second wire member passage) having an inner side surface having a shape curved in a planar view, like the wire passage 34, may be provided to extend over a second upstanding wall section 24 and the connection section 25 in the raised section 22.

The width of the wire passage 34 in the Y-direction has such a size that a wire 6 can enter the wire passage 34. The width of the wire passage 34 changes in a longitudinal direction of the lead frame 5, to reach its maximum in the vicinity of a boundary between the first upstanding wall section 23 and the connection section 25.

A shape of the wire passage 34 is not limited if the condition that the wire 6 disposed along the raised section 22 from a first bonding section 20 can intersect a surface along the raised section 22 is satisfied. Even in such a shape as that of the wire passage 34 in the fourth embodiment, an effect of suppressing the upward height of the wire 6 is obtained, thereby making it possible to achieve a reduction in the height of the semiconductor module 1 and an improvement in the productivity of the semiconductor module 1 (the efficiency of an operation of a wire bonding tool).

Through the wire passage 34, an efficiency in which an internal space 26 in the raised section 22 is filled with sealing resin can be promoted, and air contained in sealing resin can be let out of the internal space 26.

Figure 9:
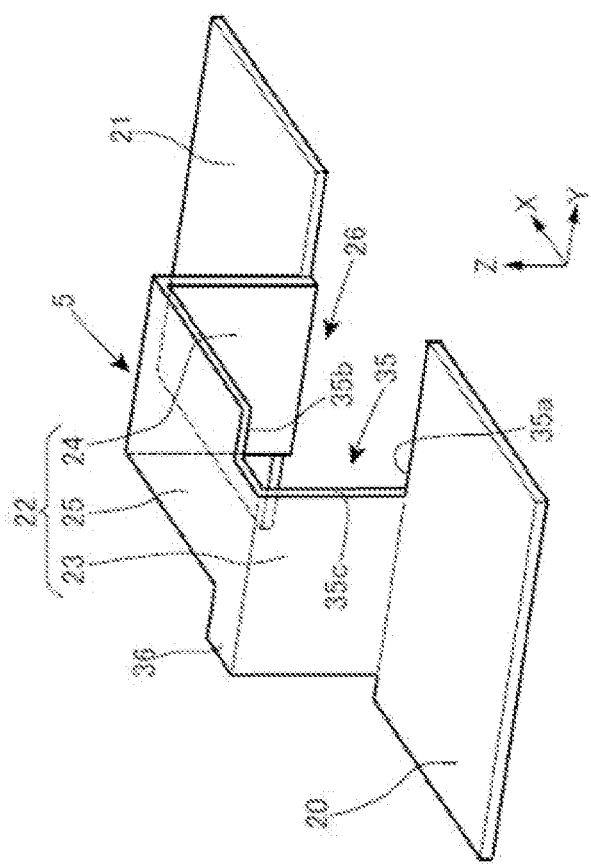
FIG. 9 is a perspective view of a lead frame constituting a wiring structure according to a fifth embodiment.

FIG. 9 is a perspective view illustrating a lead frame 5 constituting a wiring structure according to a fifth embodiment. In the above-described first to fourth embodiments, all the wire passages 30, 31, 32, 33, and 34 are each a through hole formed in the middle in the width direction (Y-direction) of the raised section 22. On the other hand, in the fifth embodiment, a wire passage 35 in the lead frame 5 is a cut-out section formed in a side portion in a width direction of a raised section 22. The wire passage 35 is formed to extend over a first upstanding wall section 23 and a connection section 25 in the raised section 22.

Specifically, the wire passage 35 has its one end portion 35a in its longitudinal direction positioned in a boundary portion between a first bonding section 20 and the first upstanding wall section 23 and its other end portion 35b in the longitudinal direction positioned in the connection section 25. Between the end portion 35a and the end portion 35b, the wire passage 35 has a structure in which a side surface 35c is formed only on one side in the Y-direction as its inner surface and the opposite side to the side surface 35c is opened in the Y-direction.

The lead frame 5 further includes a projecting section 36 in a side portion in the Y-direction on the opposite side to the wire passage 35. The projecting section 36 is a site having substantially the same width as the width of the wire passage 35 in the Y-direction and protruding sideward in the Y-direction, and is formed to extend over the first upstanding wall section 23 and the connection section 25 in the raised section 22.

The wire passage 35 is common to the above-described wire passages 30, 31, 32, 33, and 34 in that it is opened upward. When the wire 6 is attached to the first bonding section 20 and the circuit pattern 15 using a wire bonding tool, a wire 6 can be passed through the wire passage 35 without causing interference between the wire bonding tool and the raised section 22 during an operation.

When the wire passage 35 is provided, the wire 6 can be arranged to intersect the first upstanding wall section 23 and the connection section 25 in the raised section 22, to suppress the upward height of the wire 6, thereby making it possible to achieve a reduction in the height of a semiconductor module 1 and an improvement in the productivity of the semiconductor module 1 (the efficiency of an operation of the wire bonding tool).

Through the wire passage 35, an efficiency in which an internal space 26 in the raised section 22 is filled with sealing resin can be promoted, and air contained in sealing resin can be let out of the internal space 26.

The lead frame 5 is provided with the projecting section 36 so that the raised sections 22 respectively have substantially the same widths in a region where the wire passage 35 is formed and a region where the wire passage 35 is not formed. This makes a cross-sectional area in the Y-direction of any portion of the raised section 22 uniform, thereby contributing to the stability of an electrical resistance.

In addition to a configuration illustrated in FIG. 9, a second wire passage (second wire member passage) as a similar cut-out section to the wire passage 35 may be provided in a side portion in the Y-direction to extend over a second upstanding wall section 24 and the connection section 25 in the raised section 22. In this case, a second projecting section having a similar shape to that of the projecting section 36 may be provided in a side portion in the Y-direction on the opposite side to the second wire passage.

In each of the above-described first to fourth embodiments, a cross-sectional area of the lead frame 5 may be made uniform by providing a widened-shaped section like the projecting section 36 in a range, where the wire passage 30, 31, 32, 33, 34 is provided, in the lead frame 5.

As described above, according to the wiring structure and the semiconductor module 1 in each of the above-described embodiments to which the present invention is applied, the lead frame 5 is provided with the wire passage 30, 31, 32, 33, 34, 35 in a shape of opening that enables the wire 6 to be disposed along the raised section 22 from the first bonding section 20 such that the wire 6 can intersect a surface along the raised section 22. With this configuration, an amount of upward protrusion of the wire 6 is suppressed to reduce the height of the semiconductor module 1, thereby making it possible to achieve an improvement in the productivity of the semiconductor module 1. This effect is obtained by setting a shape of the lead frame 5, and does not require addition of a new component, for example, thereby preventing a structure of the semiconductor module 1 from being complicated.

The wire passage 30, 31, 32, 33, 34, 35 in each of the above-described embodiments can relatively easily be formed when the lead frame 5 is manufactured. For example, the lead frame 5 in each of the embodiments can be obtained by removing a portion corresponding to the wire passage 30, 31, 32, 33, 34, 35 by punching or cutting for a flat plate-shaped metal sheet and then making the metal sheet have a crank shape including the raised section 22 by press working. Therefore, cost reduction can be achieved.

Figure 10:
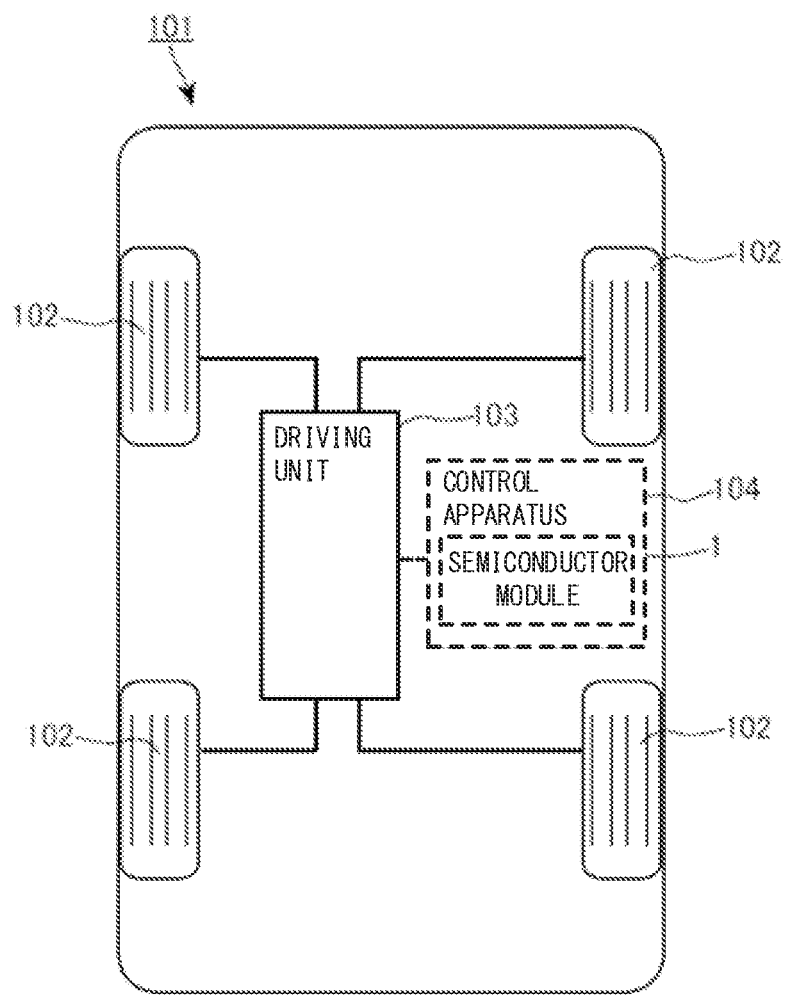
FIG. 10 is a plan schematic view illustrating an example of a vehicle to which the semiconductor module according to the present invention is applied.

A vehicle to which the present invention is applied will be described with reference to FIG. 10. FIG. 10 is a plan schematic view illustrating an example of a vehicle to which the semiconductor module according to the present invention is applied. A vehicle 101 illustrated in FIG. 10 is composed of a four-wheel vehicle including four wheels 102, for example. An example of the vehicle 101 may be an electric vehicle that drives the wheels 102 by a motor or the like or a hybrid vehicle using power of an internal combustion engine in addition to a motor.

The vehicle 101 includes a driving unit 103 that applies power to the wheels 102 and a control apparatus 104 that controls the driving unit 103. The driving unit 103 may be composed of at least one of an engine, a motor, and a hybrid of an engine and a motor, for example.

The control apparatus 104 performs control (e.g., electric power control) of the driving unit 103. The control apparatus 104 includes the above-described semiconductor module 1. The semiconductor module 1 may be configured to perform electric power control for the driving unit 103.

The semiconductor module according to the present invention is applicable to various apparatuses and devices such as an inverter of an industrial motor in addition to a vehicle.

The present invention is not limited to the above-described embodiments, but can be implemented with various changes. In the above-described embodiments, a size, a shape, a direction, and the like illustrated in the accompanying drawings are not limited to these, but are appropriately changeable within a range in which the effect of the invention is exhibited. In addition thereto, the present invention can be implemented with appropriate changes without departing from the scope of the invention.

For example, the number of members constituting a semiconductor module 1 and a layout of the members are not limited to those in the above-described embodiments, but are appropriately changeable.

An electronic component and a connection target for each other using a lead frame 5 may differ from those in each of the above-described embodiments. For example, a connection target to which a second bonding section 21 is bonded may be not a circuit pattern 14 but a semiconductor device different from the semiconductor device 4 or an external terminal of the semiconductor module 1.

A shape of a section other than a wire passage in the lead frame 5 is appropriately changeable. Although in each of the above-described embodiments, the raised section 22 in the lead frame 5 has a square u shape in a side view, and has three planar sections, i.e., the first upstanding wall section 23, the second upstanding wall section 24, and the connection section 25, respectively, as surfaces along the raised section 22, the present invention is not limited to the shape. For example, the present invention is also applicable to a raised section having a shape curved in a mountain shape as a whole in a side view (a shape having no planar section) and a raised section having a shape partially curved in a side view (a shape having a combination of a planar section and a curved section), for example.

Although the insulating circuit board 3 and the semiconductor device 4 are components each having a rectangular shape in a planar view in the above-described embodiment, the present invention is not limited to the shape. The components may be each formed in a polygonal shape other than the rectangular shape.

Although the embodiments and the modified examples have been described, the present invention may be an overall or partial combination of the above-described embodiments and modified examples as another embodiment.

The present invention is not limited to the above-described embodiments and modified examples, but various changes, replacements, and modifications may be made without departing from the spirit of the technical idea. Further, if the technical idea can be implemented using another method by advancement of technology or derivative other technology, the technical idea may be implemented using the method. Therefore, the claims cover all embodiments that can be included in the scope of the technical idea.

Feature points in the above-described embodiments are summarized below.

A wiring structure according to the above-described embodiment is a wiring structure including an electronic component and a conductive member that electrically connects the electronic component to a connection target for the electronic component, in which the conductive member includes a first bonding section bonded to the electronic component, a second bonding section bonded to the connection target, a raised section that protrudes upward from the first bonding section and is connected to the second bonding section, and a wire member passage in a shape of opening that is provided in at least a part of the raised section and enables a wire member disposed along the raised section from the first bonding section to be connected to the first bonding section such that the wire member intersects a surface along the raised section.

In the wiring structure according to the above-described embodiment, the raised section includes a first upstanding wall section that rises upward from an end portion of the first bonding section, a second upstanding wall section that rises upward from an end portion of the second bonding section, and a connection section that connects an upper end of the first upstanding wall section and an upper end of the second upstanding wall section to each other, in which the wire member passage is formed to extend over at least the first upstanding wall section and the connection section.

In the wiring structure according to the above-described embodiment, the wire member passage is further formed to extend over the first upstanding wall section and the first bonding section.

In the wiring structure according to the above-described embodiment, the wire member passage includes a first wire member passage formed to extend over at least the first upstanding wall section and the connection section, and a second wire member passage formed to extend over at least the second upstanding wall section and the connection section.

In the wiring structure according to the above-described embodiment, the second wire member passage is further formed to extend over the second upstanding wall section and the second bonding section.

In the wiring structure according to the above-described embodiment, the wire member passage is a through hole formed in the middle in a width direction of the raised section.

In the wiring structure according to the above-described embodiment, the wire member passage is a cut-out section formed in a side portion in a width direction of the raised section.

In a semiconductor module according to the above-described embodiment includes the above-described wiring structure.

A vehicle according to the above-described embodiment includes the above-described wiring structure or the above-described semiconductor module.

As described above, the present invention has an effect of enabling a productivity to be improved in a wiring structure in which a wire member is disposed along a raised section in a conductive material, and is particularly useful in a semiconductor module for industrial or electrical use and a vehicle.

REFERENCE SIGNS LIST

1: semiconductor module
2: case
3: insulating circuit board
4: semiconductor device (electronic component)
5: lead frame (conductive member)
6: wire (wire member)
7: base substrate 13: circuit pattern
14: circuit pattern (connection target for electronic component)
15: circuit pattern
20: first bonding section
21: second bonding section
22: raised section
23: first upstanding wall section
24: second upstanding wall section
25: connection section
26: internal space
30: wire passage (wire member passage, through hole)
31: wire passage (wire member passage, through hole)
32: wire passage (first wire member passage, through hole)
33: wire passage (wire member passage, through hole)
34: wire passage (wire member passage, through hole)
35: wire passage (wire member passage, cut-out section)
36: projecting section
101: vehicle
102: wheel
103: driving unit
104: control apparatus

What is claimed is:

1. A semiconductor module comprising:
an electronic component; and
a conductive member that electrically connects the electronic component to a connection target, wherein
the conductive member includes
a first bonding section configured to be bonded to the electronic component;
a second bonding section configured to be bonded to the connection target;
a raised section that protrudes upward from the first bonding section and is connected to the second bonding section; and
a wire member passage through which a wire member passes, and which is provided in at least a part of the raised section, the wire member passage enabling the wire member to be disposed along the raised section from the first bonding section to the second bonding section such that the wire member intersects a surface of the raised section.

2. The wiring structure semiconductor module according to claim 1, wherein
the raised section includes
a first upstanding wall section that rises upward from an end portion of the first bonding section,
a second upstanding wall section that rises upward from an end portion of the second bonding section, and
a connection section that connects an upper end of the first upstanding wall section and an upper end of the second upstanding wall section to each other, and
the wire member passage extends over at least the first upstanding wall section and the connection section.

3. The semiconductor module according to claim 2, wherein the wire member passage further extends over the first upstanding wall section and the first bonding section.

4. The semiconductor module according to claim 2, wherein
the wire member passage includes
a first wire member passage extending over at least the first upstanding wall section and the connection section, and
a second wire member passage extending over at least the second upstanding wall section and the connection section.

5. The semiconductor module according to claim 4, wherein the second wire member passage further extends over the second upstanding wall section and the second bonding section.

6. The semiconductor module according to claim 1, wherein the wire member passage is a through hole in the raised section at a center in a width direction of the raised section.

7. The semiconductor module according to claim 1, wherein the raised section has two opposite sides that are opposite to each other in a width direction of the raised section, and the wire member passage is a cut-out in a side edge of one of the two opposite sides.

* * * * *